(12) United States Patent
Hwang et al.

(10) Patent No.: US 10,670,661 B2
(45) Date of Patent: Jun. 2, 2020

(54) BATTERY MANAGEMENT APPARATUS AND METHOD

(71) Applicant: Samsung Electronics Co., Ltd., Suwon-si (KR)

(72) Inventors: Hyo Sun Hwang, Seoul (KR); Jin Ho Kim, Yongin-si (KR); Sang Do Park, Seoul (KR); Tae Won Song, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 568 days.

(21) Appl. No.: 15/367,606

(22) Filed: Dec. 2, 2016

(65) Prior Publication Data

US 2017/0184679 A1 Jun. 29, 2017

(30) Foreign Application Priority Data

Dec. 24, 2015 (KR) ........................ 10-2015-0186642

(51) Int. Cl.
*G01R 31/36* (2020.01)
*G01R 31/367* (2019.01)
*G01R 31/382* (2019.01)
*G01R 31/392* (2019.01)

(52) U.S. Cl.
CPC ......... *G01R 31/367* (2019.01); *G01R 31/382* (2019.01); *G01R 31/392* (2019.01)

(58) Field of Classification Search
None
See application file for complete search history.

(56) References Cited

U.S. PATENT DOCUMENTS

| | | | |
|---|---|---|---|
| 7,622,897 B2 | 11/2009 | Eberhard et al. | |
| 8,508,191 B2 | 8/2013 | Kim et al. | |
| 8,577,529 B2 | 11/2013 | Takahashi et al. | |
| 2009/0027056 A1* | 1/2009 | Huang | B60L 58/12 324/439 |
| 2009/0058367 A1 | 3/2009 | Naik | |
| 2012/0049802 A1 | 3/2012 | Barsukov et al. | |
| 2013/0205147 A1* | 8/2013 | Tsao | G06F 1/3212 713/322 |
| 2014/0191731 A1 | 7/2014 | Miura | |
| 2014/0236511 A1 | 8/2014 | Kulkarni et al. | |
| 2017/0331162 A1* | 11/2017 | Clarke | H01M 10/446 |

FOREIGN PATENT DOCUMENTS

| | | |
|---|---|---|
| JP | 2000-294299 A | 10/2000 |
| JP | 2010-283922 A | 12/2010 |
| JP | 5430794 B2 | 12/2013 |
| KR | 10-2007-0117259 A | 12/2007 |
| KR | 10-2014-0082752 A | 7/2014 |

\* cited by examiner

*Primary Examiner* — Aditya S Bhat
(74) *Attorney, Agent, or Firm* — NSIP Law

(57) ABSTRACT

Provided are battery management apparatuses and methods. The battery management apparatus includes a sensitivity determiner configured to determine sensitivity of a battery state based on sensed battery information and previous battery state information, and an execution parameter adjuster configured to adjust a parameter for estimating the battery state based on the determined sensitivity of the battery state.

23 Claims, 8 Drawing Sheets

BATTERY MANAGEMENT APPARATUS AND METHOD

CROSS-REFERENCE TO RELATED APPLICATION(S)

This application claims the benefit under 35 U.S.C. § 119(a) of Korean Patent Application No. 10-2015-0186642, filed on Dec. 24, 2015, in the Korean Intellectual Property Office, the entire disclosure of which is incorporated herein by reference for all purposes.

BACKGROUND

1. Field

The following description generally relates to an apparatus and method for battery management based on scheduling of a battery state estimation algorithm.

2. Description of Related Art

Battery Management System (BMS) is used to optimize battery life. It is desirous to have a BMS that accurately measures a battery state and controls modules related to temperature of a battery and charging and discharging of a battery based on the measured state. In order to estimate a battery state, the BMS uses data such as, voltage, temperature, and current of a battery.

When data such as, voltage and current of a battery is measured or calculated to estimate a battery state, data values, including the measured or calculated voltage or current, may vary depending on battery environments. Accordingly, measurement accuracy of battery data is valuable for battery management.

In order to improve measurement accuracy of battery data or a battery state, the algorithm complexity has increased, in which an electrochemical model is used instead of a Coulomb counting method. Accuracy of an algorithm is important to increase efficiency in the battery management system, but in this case, the unit of modules to be controlled becomes smaller.

For this reason, the number of modules, of which SOC is to be calculated, is increased, which in turn increases the calculation of the entire algorithms of the BMS. Accordingly, as the requirements of the BMS are increased, complexity of system is increased, and power consumption is also increased.

SUMMARY

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

In one general aspect, there is provided a battery management apparatus including a processor configured to determine sensitivity of a battery state based on sensed battery information and previous battery state information, and adjust a parameter to estimate the battery state based on the determined sensitivity of the battery state.

The processor may include a sensitivity determiner configured to determine sensitivity of the battery state based on the sensed battery information and the previous battery state information, and an execution parameter adjuster configured to adjust the parameter for estimating the battery state based on the determined sensitivity of the battery state.

The sensitivity determiner may be configured to measure a variation per unit time in the battery state based on any one or any combination of the battery information and the previous battery state information, and to determine the sensitivity based on the measured variation per unit time.

The apparatus may include the battery information comprises any one or any combination of voltage, current, temperature, charge time, and discharge time, and the previous battery state information may include at least one of state of charge (SOC) or state of health (SOH).

The parameter may include any one or any combination of an execution period and an optimization process of a battery state estimation algorithm.

The execution parameter adjuster may be further configured to shorten the execution period of the battery state estimation algorithm, in response to an increase in the determined sensitivity.

The battery state estimation algorithm may include any one or any combination of an SOC estimation algorithm and an SOH estimation algorithm.

The processor may include an execution parameter determiner configured to determine an execution parameter to be adjusted based on any one or any combination of a type of the battery state estimation algorithm and a calculated variation in the sensitivity.

The processor may include a scheduling period setter configured to set an initial operating period of each element of the battery management apparatus as a sensing period of the battery information, and to adjust an operating period of the each element of the battery management apparatus based on the previous battery state information.

The execution parameter determiner may be further configured to determine the execution parameter to be adjusted and a value of the execution parameter, in response to the calculated variation in the sensitivity exceeding a threshold.

The apparatus may include a memory configured to store instructions, and wherein the processor may be configured to execute the instructions to determine sensitivity of a battery state based on sensed battery information and previous battery state information, and to adjust a parameter to estimate the battery state based on the determined sensitivity of the battery state.

In another general aspect, there is provided a battery management method including determining sensitivity of a battery state based on sensed battery information and previous battery state information, and adjusting an execution parameter to estimate the battery state based on the determined sensitivity of the battery state.

The determining of the sensitivity may include measuring a variation per unit time in the battery state based on any one or any combination of the battery information and the previous battery state information, and determining the sensitivity based on the measured variation per unit time.

The battery information may include any one or any combination of voltage, current, temperature, charge time, and discharge time, and the previous battery state information may include at least one of state of charge (SOC) and state of health (SOH).

The execution parameter may include any one or any combination of an execution period and an optimization process of a battery state estimation algorithm.

The adjusting of the execution parameter may include shortening the execution period, in response an increase in the determined sensitivity.

The battery state estimation algorithm may include any one or any combination of an SOC estimation algorithm and an SOH estimation algorithm.

The method may include determining an execution parameter to be adjusted based on any one or any combination of a type of the battery state estimation algorithm and a calculated variation in the sensitivity.

The method may include setting an initial operating period of each element of a battery management apparatus as a sensing period of the battery information, and adjusting an operating period of the each element of the battery management apparatus based on the previous battery state information.

Other features and aspects will be apparent from the following detailed description, the drawings, and the claims.

Figure 1:
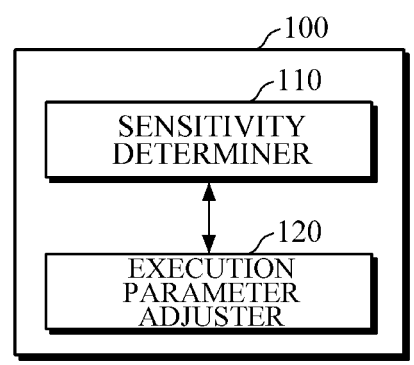
FIG. 1 is a diagram illustrating an example of a battery management apparatus.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or apparatuses described herein. However, various changes, modifications, and equivalents of the methods, apparatuses, and/or apparatuses described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or apparatuses described herein that will be apparent after an understanding of the disclosure of this application.

FIG. 1 is a diagram illustrating an example of a battery management apparatus. In an example, the battery management apparatus 100 is an apparatus that manages a battery by dynamically scheduling a battery state estimation algorithm (hereinafter referred to as an "algorithm"). In an example, the algorithm may include an algorithm that estimates a State Of Charge (SOC) or a State Of Health (SOH), and based on the estimation of a battery state, the algorithm may be classified as a static algorithm that is initially scheduled or as a dynamic algorithm that is scheduled dynamically, which will be described in detail below. The SOC refers to information on a quantity of electric charge of a battery, and the SOH refers to information on how much battery performance has deteriorated as compared to performance at the time of manufacture.

Referring to FIG. 1, the battery management apparatus 100 includes a sensitivity determiner 110 and an execution parameter adjuster 120.

The sensitivity determiner 110 determines sensitivity of a battery state based on at least one of sensed battery information and previous battery state information. The battery information comprises information such as, voltage, current, temperature, measuring time, and charge/discharge time of the battery. The previous battery state information is previously measured information such as, for example, voltage, current, temperature, charge/discharge time, SOC and SOH information of the battery.

In an example, the sensitivity determiner 110 determines sensitivity of a battery state based on battery information or battery state information that varies per unit time depending on the condition or ambient environment of a battery. The battery condition includes conditions such as, for example, an internal temperature of a battery, manufacture characteristics, and the ambient environment may be an external temperature of a battery.

For example, when there is a small variation per unit time in the battery information or battery state information, the sensitivity determiner 110 may determine sensitivity to be low, and when there is a large variation per unit time in the battery information or battery state information, the sensitivity determiner 110 may determine sensitivity to be high. A low sensitivity means the battery information or battery state information, which is calculated using the battery state estimation algorithm, is maintained for a long period of time, leading to a longer interval before executing a subsequent algorithm. A high sensitivity means that the battery information or battery state information is maintained for a short period of time, and may refer to a case where the battery information or battery state information per unit time changes rapidly. In this case, the battery management apparatus 100 may adjust an algorithm execution period to be shorter to accurately estimate a battery state.

Figure 2:
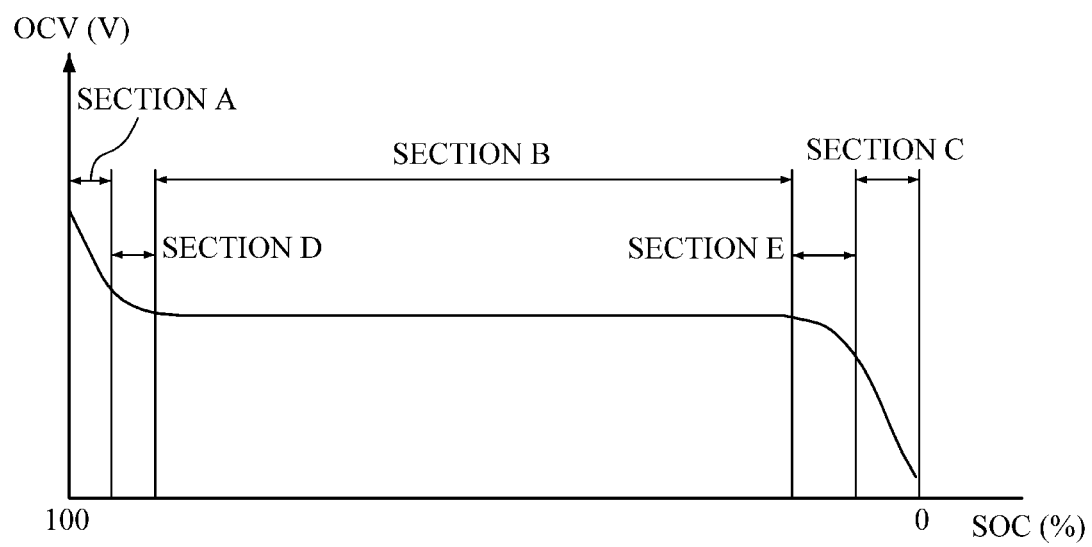
FIG. 2 is a diagram illustrating an example of an SOC graph using an Open Circuit Voltage (OCV) method that estimates battery life by measuring an open circuit voltage of a battery.

FIG. 2 is a diagram illustrating an example of an SOC graph using an Open Circuit Voltage (OCV) method that estimates battery life by measuring an open circuit voltage of a battery, in which an OCV variation dependent on the SOC are shown.

Referring to FIGS. 1 and 2, in section A the battery starts to discharge after being completely charged and in section C the battery is about to be completely discharged. In Section C, there is a large variation in the OCV dependent on a variation in the SOC, whereas in section B, there is a small variation in the OCV. Section D is the transition between Sections A and B, and Section E is the transition between Sections C and B. In Section D, the variation in the OCV decreases with the variation per unit time in the SOC, as compared to Section A. In Section E, the variation in the OCV increases with the variation per unit time in the SOC, as compared to Section B. As the variation per unit time in the OCV varies depending on whether the SOC of a battery is in section A, B, C, D, or E, the sensitivity determiner 110 determines different sensitivities for each section.

For example, the sensitivity determiner 110 determines a high sensitivity for section A, since there is a large variation in the OCV dependent on the variation per unit time in the SOC in section A. In another example, the sensitivity determiner 110 determines a low sensitivity for section B, since there is a small variation in the OCV dependent on the variation per unit time in the SOC in section B.

In an example, the execution parameter adjuster 120 adjusts an execution parameter value of an algorithm based on the determined sensitivity. In an example, the execution parameter includes at least one of an execution period or an optimization process of an algorithm. But, the execution parameter is not limited thereto, and may include any execution parameter that may affect the accuracy and an execution time of the algorithm.

The algorithm execution period is a parameter that determines accuracy of battery state estimation and an amount of power consumption. When the execution period of an algorithm becomes shorter, estimation accuracy of a battery state may be increased, but power consumption is also increased. When the execution period of an algorithm becomes longer, estimation accuracy of a battery state is reduced, but power consumption is also decreased.

The execution parameter adjuster 120 may adjust the algorithm execution period based on the determined sensitivity, in which the period may be adjusted in various manners according to criteria, such as, for example, a criterion that determines a priority between estimation accuracy of a battery state and/or the amount of power consumption. In an example, the criteria may be predetermined.

For example, in the case where priority is put on the amount of power consumption, the execution parameter adjuster 120 may reduce the amount of power consumption of an algorithm execution module by adjusting an algorithm execution period to be longer, even when sensitivity is determined to be high. In an example where priority is put on the accuracy of a battery state, rather than on the amount of power consumption, the execution parameter adjuster 120 may accurately estimate a battery state by adjusting an execution period of a dynamic algorithm to be shorter, even when sensitivity is determined to be low.

In addition, among the execution parameters, the optimization process of an algorithm may include determining which algorithm to apply and/or selecting a method of executing an algorithm. The method of executing an algorithm may include selecting either a dynamic algorithm or a static algorithm, or a combination of both. Other the execution parameters, such as, for example, remaining battery life, battery state, capacity, charging or discharging state of a battery, method of executing a selected algorithm, power consumption of an algorithm execution module, required time to execute an algorithm, and any other execution parameters that may affect an algorithm may be used for optimization process of an algorithm without departing from the spirit and scope of the illustrative examples described.

The above-described optimization process of an algorithm is merely illustrative, and execution parameter values of an algorithm may be adjusted by considering an ambient environment where a battery operates, charging and discharging state of a battery, temperature of a battery, and the number of battery modules.

In an example, the execution parameter adjuster 120 stores execution parameter values to be adjusted in a parameter storage (not shown) which is designated for the execution of an algorithm.

Figure 3:
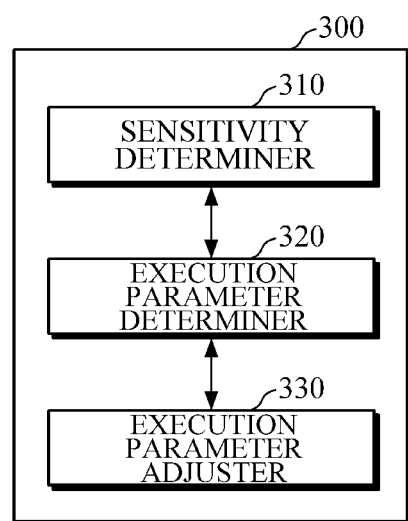
FIG. 3 is a diagram illustrating an example of a battery management apparatus.

FIG. 3 is a diagram illustrating another example of a battery management apparatus. Referring to FIG. 3, the battery management apparatus 300 includes a sensitivity determiner 310, an execution parameter determiner 320, and an execution parameter adjuster 330. In addition to the description of FIG. 3 below, the above descriptions of FIGS. 1-2, are also applicable to FIG. 3, and are incorporated herein by reference. Thus, the above description may not be repeated here.

The sensitivity determiner 310 determines sensitivity of a battery based on at least one of sensed battery information and previous battery state information.

In an example, the execution parameter determiner 320 determines an execution parameter to be adjusted using the determined sensitivity, and based on the types of an algorithm and/or a variation in sensitivity. As described above, the execution parameter includes at least one of an execution period and an optimization process of an algorithm, and the variation in sensitivity may be a difference in sensitivities determined by the sensitivity determiner 310. In an example, the execution parameter determiner 320 calculates a difference between the sensitivity determined by the execution of a previous algorithm, and the sensitivity determined by the execution of a current algorithm, and may use the difference as a variation in sensitivity.

For example, even when the SOC and SOH are estimated for a uniform period using an identical algorithm, the variation per unit time may vary depending on a battery operating environment. The variation per unit time may increase when a battery operates at a high or low temperature, rather than at room temperature. Based on the sensed battery information, the execution parameter determiner 320 may determine, according to a battery operating environment, an execution parameter to be adjusted, e.g., a temperature measuring period and an execution period of a battery temperature management apparatus.

In another example, the variation per unit time in the SOH may also vary depending on a battery operating temperature. In the case where a battery is deteriorated below a specific threshold, the variation per unit time may be increased. Accordingly, the execution parameter determiner 320 may determine an execution parameter that checks whether a battery is deteriorated below a threshold, e.g., a battery voltage measurement period.

The execution parameter determiner 320 may calculate a variation between a currently determined sensitivity and a previous sensitivity, and may determine an execution parameter to be adjusted and a value of the execution parameter using the calculated variation. For example, when the calculated sensitivity variation exceeds a reference variation ($\theta$), the execution parameter determiner 320 may determine an execution parameter, which most affects the accuracy, to be an execution parameter to be adjusted among various parameters. In an example, when a sensitivity variation is not above the reference variation ($\theta$), there may be a slight change in an execution parameter, and even when the execution parameter is adjusted, the execution parameter may not affect the accuracy, such that the execution parameter determiner 320 may determine not to adjust the execution parameter to prevent unnecessary resetting. The reference variation ($\theta$) is a threshold to determine an execution parameter, as compared to the sensitivity variation calculated by the execution parameter determiner 320, and the reference variation ($\theta$) may be initially set according to a purpose of a user or manager, or may be updated by the battery management apparatus 300 according to an operating environment and purpose of use of a battery.

Referring to FIG. 2, the variation in the OCV is increased with the variation per unit time in the SOC in section A above, such that sensitivity in section A may be determined to be high.

Accordingly, in the case where a current execution period is in section A even if the sensitivity determined for section A is high, the execution parameter determiner 320 may determine a variation in sensitivity, i.e., a difference between the previous sensitivity and the sensitivity determined in the current execution period, to be small.

Upon calculating the variation in sensitivity, the execution parameter determiner 320 may compare the sensitivity variation with the reference variation (θ), and may determine a parameter to be adjusted based on the comparison. For example, in response to the variation in sensitivity being below the reference variation (θ), the execution parameter determiner 320 may determine that a battery state is not suddenly changed, and may omit the determination to adjust the parameter.

Section D is between section A, where the variation in the OCV is increased with the variation per unit time in the OSC, and section B, where there is a small variation in the OCV dependent on the variation per unit time in the SOC. In section D, the execution parameter determiner 320 may determine that a sensitivity variation is large.

When there is a large variation in sensitivity, the execution parameter determiner 320 determines that a battery state is suddenly changed, and may determine an algorithm execution parameter to be adjusted. For example, the execution parameter determiner 320 may determine to update an algorithm execution period to measure a suddenly changing battery state more accurately, and the execution parameter adjuster 330 may adjust an execution period to be shorter.

Figure 4:
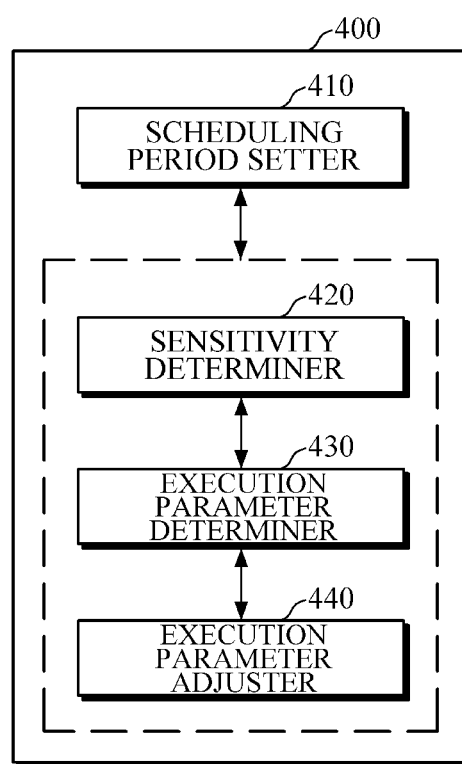
FIG. 4 is a diagram illustrating an example of a battery management apparatus.

FIG. 4 is a diagram illustrating an example of a battery management apparatus. Referring to FIG. 4, the battery management apparatus 400 includes a scheduling period setter 410, a sensitivity determiner 420, an execution parameter determiner 430, and an execution parameter adjuster 440. In addition to the description of FIG. 4 below, the above descriptions of FIGS. 1-3, are also applicable to FIG. 4, and are incorporated herein by reference. Thus, the above description may not be repeated here.

The scheduling period setter 410 sets an initial operating period of each element of the battery management apparatus 400 to be the same as a battery information sensing period, and may adjust the operating period of each element of the battery management apparatus 400 based on previous battery state information.

For example, the scheduling period setter 410 may perform synchronization of the initial operating period of the battery management apparatus 400 with the battery information sensing period. Such setting of a scheduling period may be used to identify an initial battery state. Based on the sensed battery information, the battery management apparatus 400 may determine sensitivity, and repeat an algorithm updating cycle to identify a previous battery state, and may apply an algorithm appropriate for a current battery state. For example, when the sensitivity determined based on the battery information and battery state information is low, the scheduling period setter 410 may set the battery information sensing period to be longer, and may perform synchronization of the operating period of the battery management apparatus 400 with the determined battery information sensing period.

Further, the scheduling period setter 410 may set an execution period of each element by comparing power consumed for sensing the battery information with power consumed by an algorithm execution module. For example, in the case where power consumed by an algorithm execution module is greater than power consumed for sensing battery information, the scheduling period setter 410 may perform sensing of battery information twice when an algorithm is executed once, and may use an average of sensed battery information values.

Figure 5:
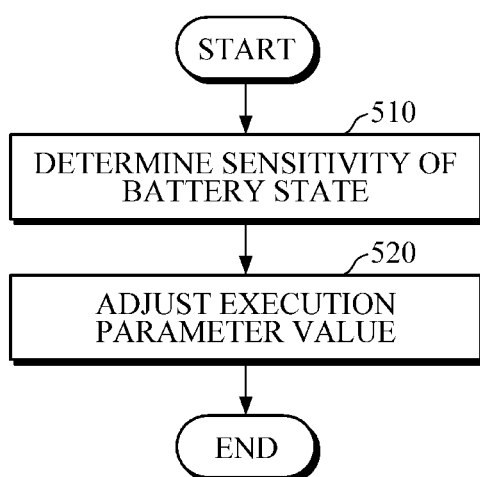
FIG. 5 is a diagram illustrating an example of a method of scheduling a battery state estimation algorithm.

FIG. 5 is a diagram illustrating an example of a method of scheduling a battery state estimation algorithm. The operations in FIG. 5 may be performed in the sequence and manner as shown, although the order of some operations may be changed or some of the operations omitted without departing from the spirit and scope of the illustrative examples described. Many of the operations shown in FIG. 5 may be performed in parallel or concurrently. In addition to the description of FIG. 5 below, the above descriptions of FIGS. 1-4, are also applicable to FIG. 5, and are incorporated herein by reference. Thus, the above description may not be repeated here.

FIG. 5 may be an example performed by the battery management apparatus 100 illustrated in FIG. 1. A general battery management apparatus initially sets an execution parameter of a static algorithm, and executes the static algorithm by using the initially set execution parameter. As will be described with reference to FIG. 7, a scheduler 710 may be mounted in a battery management apparatus 700, and may adjust in real time an execution parameter of a dynamic algorithm mounted in a battery management apparatus 700.

Referring to FIG. 5, in 510, the battery management apparatus 100 may determine sensitivity of a battery state based on at least one of sensed battery information and battery state information. Variations per unit time in the battery information and previous battery state information may vary depending on the condition and ambient environment of a battery, and the battery management apparatus 100 may determine sensitivity based on such variations.

For example, sensitivity determined by the battery management apparatus 100 is expressed in different units depending on the battery information or battery state information used to determine sensitivity. A low sensitivity means that a calculation result of the battery information or battery state information is maintained for a long period of time, leading to a longer waiting time for executing a subsequent algorithm. A high sensitivity means that a calculation result of the battery information or battery state information is changes rapidly.

In the case of a high sensitivity, the battery management apparatus 100 may adjust an algorithm execution period to be shorter to accurately estimate a battery state.

Referring to FIG. 2, variations in the OCV based on variations per unit time in the SOC may vary depending on whether the SOC of a battery is in section A, B, C, D, or E. Accordingly, sensitivity determined by the battery management apparatus 100 may be different for each section.

For example, the battery management apparatus 100 may determine a high sensitivity for section A where there is a large variation in the OCV dependent on a variation per unit time in the SOC.

In another example, the battery management apparatus 100 determines an execution parameter to be adjusted by comparing a sensitivity variation with a reference variation (θ), and adjusts the determined execution parameter. The sensitivity variation refers to a sensitivity difference between a previous sensitivity and the sensitivity determined by the battery management apparatus 100 upon executing a current algorithm.

In an example, the battery management apparatus 100 determines a high sensitivity for section A where there is a large variation in the OCV dependent on the variation in the SOC. In section A, a sensitivity variation, i.e., a difference between the previous sensitivity and the sensitivity determined by the battery management apparatus 100 upon executing a current algorithm, may be calculated to be small.

In section D, which is between section A where sensitivity is determined to be high and section B where sensitivity is determined to be low, a sensitivity variation, i.e., a difference between the previous sensitivity and the sensitivity determined by the battery management apparatus 100 upon executing a current algorithm, may be calculated to be large. That is, a large variation in sensitivity indicates that a battery state is suddenly changed, and accordingly, the battery management apparatus 100 may adjust an execution parameter to accurately identify a suddenly changing battery state.

The battery management apparatus 100 may compare a reference variation ($\theta$) with the sensitivity as determined. In an example, the reference variation ($\theta$) is predetermined.

For example, upon comparison of the reference variation ($\theta$) with the sensitivity determined by the battery management apparatus 100, if a variation in the sensitivity is below the reference variation ($\theta$), the battery management apparatus 100 determines that the battery state calculated by the algorithm is maintained for a long period of time, and may determine not to update an execution parameter and an execution period. In this manner, power consumption of an algorithm execution module may be reduced, and the accuracy may be increased.

Referring back to FIG. 5, in 520, the battery management apparatus 100 may adjust an execution parameter value of a dynamic algorithm based on sensitivity and/or sensitivity variations in sensed battery information or battery state information.

The parameter of the battery management apparatus 100 may include an execution period or an optimization process of an algorithm, but the execution parameter is not limited thereto, and may include any execution parameter that may affect the accuracy and an execution time of the algorithm.

For example, the battery management apparatus 300 determines an execution parameter to be an execution period based on the calculated sensitivity variation, and may adjust the execution period. For example, as shown in section D of FIG. 2, in the case where the sensitivity variation is greater than the reference variation ($\theta$), the battery management apparatus 300 determines that the value calculated by the algorithm is maintained for a long period of time, and may adjust an updating period and an execution period of an algorithm to be longer than a previous period.

Figure 6:
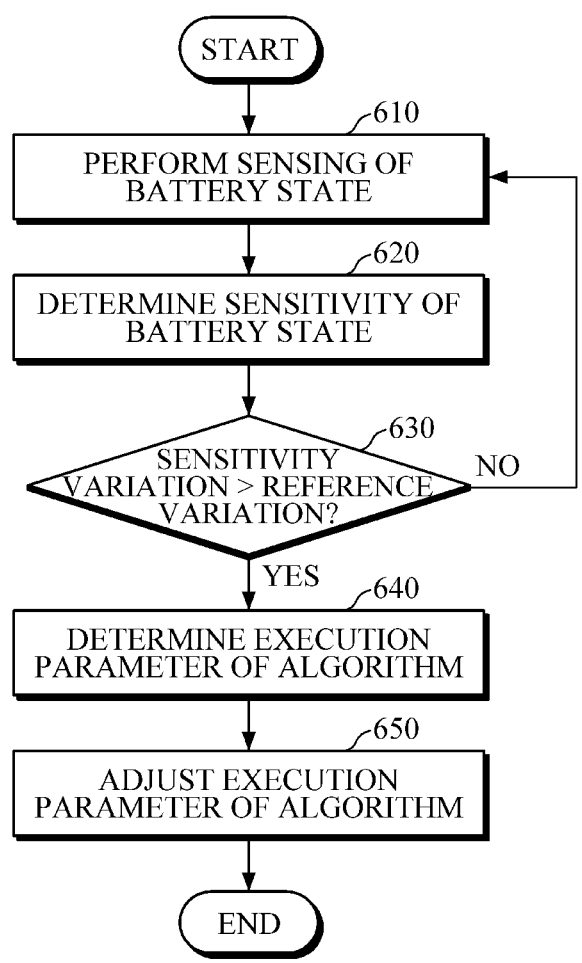
FIG. 6 is a diagram illustrating an example of a method of scheduling a battery state estimation algorithm.

FIG. 6 is a diagram illustrating an example of a method of scheduling a battery state estimation algorithm. The operations in FIG. 6 may be performed in the sequence and manner as shown, although the order of some operations may be changed or some of the operations omitted without departing from the spirit and scope of the illustrative examples described. Many of the operations shown in FIG. 6 may be performed in parallel or concurrently. In addition to the description of FIG. 6 below, the above descriptions of FIGS. 1-5, are also applicable to FIG. 6, and are incorporated herein by reference. Thus, the above description may not be repeated here.

Referring to FIGS. 4 and 6, in 610, the battery management apparatus 400 measures battery information. In addition to the battery information mentioned above, in an example, the battery information includes basic information, such as, for example, power consumption of each element included in the battery management apparatus 400, charge and/or discharge time of a battery, which may be applied to update an algorithm.

In 620, the battery management apparatus 400 may determine sensitivity of a battery state based on the measured battery data. For example, the battery management apparatus 400 determines sensitivity of a battery state based on the battery information and/or battery state information that varies per unit time according to the condition or ambient environment of a battery.

In 630, the battery management apparatus 400 compares a sensitivity variation, i.e., a difference between a previous sensitivity and the sensitivity determined by the battery management apparatus upon executing a current algorithm, with a reference variation ($\theta$). In an example, the reference variation ($\theta$) may be initially set according to a purpose of a user or manager. In another example, the reference variation ($\theta$) may be updated by the battery management apparatus 300 according to an operating environment and purpose of use of a battery.

For example, as described above with reference to FIG. 2, in section A where sensitivity is determined to be high, a sensitivity variation, i.e., a difference between the previous sensitivity and the sensitivity determined by the battery management apparatus 400 upon executing the algorithm, may be determined to be small. In this case, the battery management apparatus 400 may compare the calculated sensitivity variation with the reference variation ($\theta$). Upon comparison, if the sensitivity variation is below the reference variation ($\theta$), the battery management apparatus 400 may maintain a previously determined parameter without determining, updating, or adjusting an execution parameter of an algorithm.

Referring back to FIG. 2, in section D, which is between section A where sensitivity is determined to be high, and section B where sensitivity is determined to be low, a sensitivity variation, i.e., a difference between the previous sensitivity and the sensitivity determined by the battery management apparatus 400 upon executing a current algorithm, may be calculated to be large. In this case, the battery management apparatus 400 may compare the calculated sensitivity variation with the reference variation ($\theta$). Upon comparison, if the sensitivity variation is greater than the reference variation ($\theta$), in 640, the battery management apparatus 400 may determine an algorithm execution parameter to be adjusted. Upon comparison, if the sensitivity variation is below the reference variation ($\theta$), the battery management apparatus 400 may perform sensing of the battery data again in 610.

In 650, upon determining the execution parameter to be adjusted, the battery management apparatus 400 may adjust the execution parameter of an algorithm. In an example, the execution parameter to be adjusted may include an execution period or an optimization process of an algorithm, and may further include various execution parameters that affect the measurement accuracy of a battery state. For example, by considering sensitivity or power consumption of the battery management apparatus 400, the battery information measurement period may be adjusted to be faster or slower. For example, by adjusting the measurement period of voltage, included in the battery information, to be faster, a voltage variation of a battery may be measured more accurately.

As described above, by adjusting the measurement period of a battery state, the voltage variation of a battery may be measured accurately, and reduction of the SOH to a level below a predetermined threshold may be identified. In this case, by determining and adjusting an execution parameter of a battery state estimation algorithm, the battery life may be estimated accurately.

The above methods are merely an example, and the present disclosure is not limited thereto. Execution parameter values of an algorithm may be adjusted by considering factors such as, for example, ambient environment where a battery operates, charging and discharging state of a battery, temperature of a battery, and number of battery modules.

Figure 7:
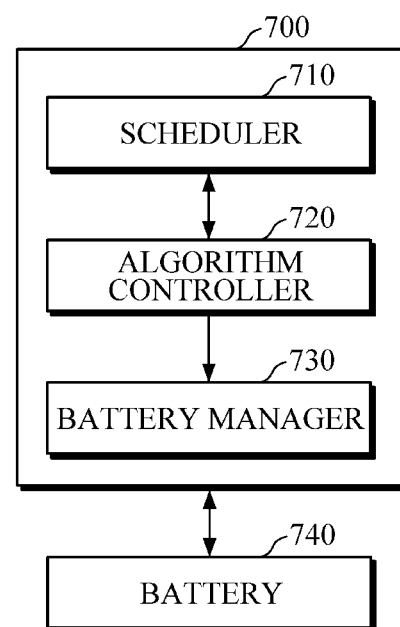
FIG. 7 is a diagram illustrating still an example of a battery management apparatus.

FIG. 7 is a diagram illustrating still another example of a battery management apparatus. Referring to FIG. 7, the battery management apparatus 700 includes a scheduler 710, an algorithm controller 720, a battery manager 730, and a battery 740.

In an example, the scheduler 710 sets a specific value as an algorithm execution parameter of the algorithm controller 720 at the time of initialization of an apparatus.

The scheduler 710 determines sensitivity of a battery state based on battery information or battery state information that varies per unit time according to the condition or ambient environment of a battery. In an example, in the case of a small variation per unit time in the battery information or battery state information, the scheduler 710 determines sensitivity to be low, and in the case of a large variation per unit time in the battery information or battery state information, the scheduler 710 determines sensitivity to be high.

A low sensitivity means that a result of calculation of the battery information or battery state information, which is calculated by using the battery state estimation algorithm, is maintained for a long period of time. A high sensitivity means that a result of calculation of the battery information or battery state information, which is calculated using the battery state estimation algorithm, is maintained for a short period of time, and may refer to a case where the battery information or battery state information is suddenly changed. In this case, an algorithm execution period may be adjusted to be shorter to accurately estimate a battery state.

For example, referring to FIG. 2, the scheduler 710 may determine sensitivity using the variation in the OCV dependent on the variation in the SOC. In the case where the variation in the OCV is increased with the variation in the SOC remaining the same, sensitivity of a battery state in that section of the SOC may be determined to be high. Upon determining that sensitivity is high, the scheduler 710 may determine that the SOC value per unit time calculated by using the battery estimation algorithm is suddenly changed, and may adjust a period of executing the battery estimation algorithm to be shorter for high estimation accuracy of a battery state.

The algorithm controller 720 may execute an algorithm according to an algorithm operation schedule determined based on sensitivity of a battery state, in which the algorithm controller 720 may include any one of a static algorithm or a dynamic algorithm.

The static algorithm, which may be included in the algorithm controller 720, may be executed regularly using an execution parameter set at the initial state of a system, regardless of data newly input from an external source. Further, the algorithm controller 720 may include the dynamic algorithm in which an execution parameter may be changed in real time. An execution period of the dynamic algorithm may be changed using the sensitivity determined by the scheduler 710, and an execution parameter determined based on a sensitivity variation, i.e., a difference between the previous sensitivity and the current sensitivity, and may be executed in different manners depending on the optimization of the algorithm.

In an example, the static algorithm may be included or excluded and if the static algorithm is included, the number of static algorithm may be determined based on factors such as, for example, environment where the battery management apparatus 700 is applied, a purpose of use of the battery.

The battery manager 730 will be described below with reference to FIG. 8.

Figure 8:
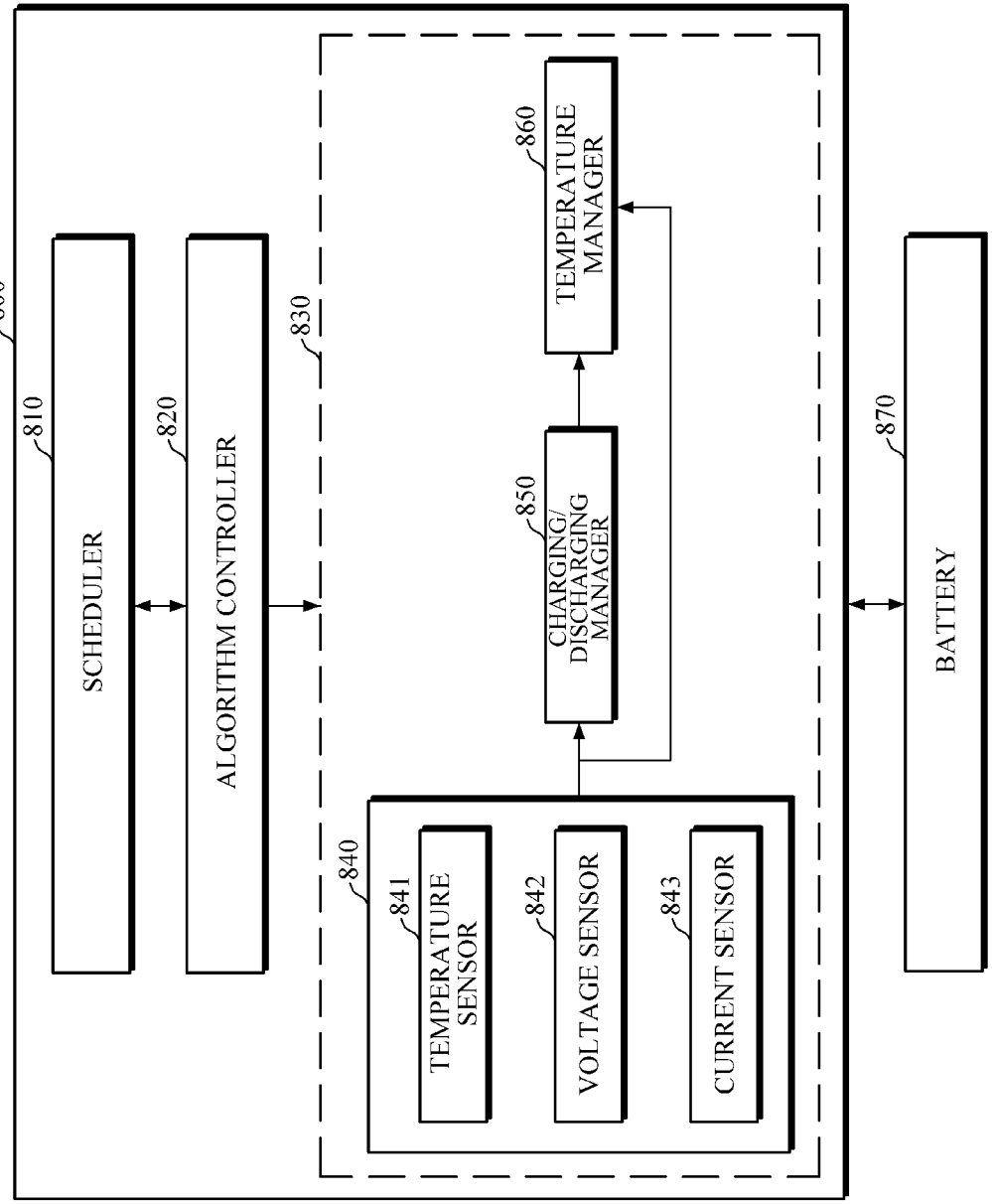
FIG. 8 is a diagram illustrating an example of a battery management apparatus.

FIG. 8 is a diagram illustrating yet another example of a battery management apparatus.

Referring to FIG. 8, the battery management apparatus 800 includes a scheduler 810, an algorithm controller 820, a battery manager 830, a battery information sensor 840, a charge/discharge manager 850, and a temperature manager 860.

The battery manager 830 includes the battery information sensor 840, the charging/discharging manager 850 that manages charging and discharging of a battery based on an algorithm scheduled by the scheduler 810, and the temperature manager 860 that manages temperature of a battery based on measured battery information and a charging/discharging state of a battery.

In an example, the battery information sensor 840 includes a temperature sensor 841, a voltage sensor 842, and a current sensor 843. Other elements that measures basic information that may be applied to update a battery state estimation algorithm such as, for example, a power sensor (not shown) that measures power consumption of each element of the battery management apparatus 800, a time sensor (not shown) that measures charge or discharge time of a battery, may be used without departing from the spirit and scope of the illustrative examples described.

The battery information sensor 840 may transmit the measured battery information to the scheduler 810, the charging/discharging manager 850, and the temperature manager 860.

The charging/discharging manager 850 may manage charging and discharging of a battery based on a battery sensitivity determined by the scheduler 810 and a sensitivity variation.

Referring to FIG. 2, the SOC of a battery decreases sharply in section C. If such sharp change in a battery state is not managed, overcharging or over-discharging of a battery may lead to damage or explosion of a battery. Accordingly, the charging/discharging manager 850 may block power supply to a battery in the case where there is a sharp change in a battery state.

For example, the charging/discharging manager 850 may estimate a charging state of a battery by using methods, such as, for example, Coulomb counting, equivalent circuit model, electrochemical model, or data-based method. However, such methods are merely illustrative, such that charging and discharging of a battery may be managed using other methods according to need by considering performance, and operation characteristics of a battery.

Based on the temperature, voltage, and current of a battery measured by the battery information sensor 840, the temperature manager 860 may control the internal temperature of a battery to be maintained within a predetermined range by controlling a cooling system or a heating system.

In an example, the battery management apparatus 100, battery management apparatus 300, battery management apparatus 400, battery management apparatus 700, and battery management apparatus 800 may be embedded in or interoperate with various digital devices such as, for example, a mobile phone, a cellular phone, a smart phone, a wearable smart device (such as, for example, a ring, a watch, a pair of glasses, glasses-type device, a bracelet, an ankle bracket, a belt, a necklace, an earring, a headband, a helmet, a device embedded in the cloths), a personal computer (PC), a laptop, a notebook, a subnotebook, a netbook, or an ultra-mobile PC (UMPC), a tablet personal computer (tablet), a phablet, a mobile internet device (MID), a personal digital assistant (PDA), an enterprise digital assistant (EDA), a digital camera, a digital video camera, a portable game console, an MP3 player, a portable/personal multimedia player (PMP), a handheld e-book, an ultra mobile personal computer (UMPC), a portable lab-top PC, a global positioning system (GPS) navigation, a personal navigation device or portable navigation device (PND), a handheld game console, an e-book, and devices such as a high definition television (HDTV), an optical disc player, a DVD player, a Blue-ray player, a setup box, robot cleaners, a home appliance, content players, communication systems, image processing systems, graphics processing systems, other consumer electronics/information technology (CE/IT) device, or any other device capable of wireless communication or network communication consistent with that disclosed herein. The digital devices may be may be embedded in or interoperate with a smart appliance, an intelligent vehicle, an electric vehicle, a hybrid vehicle, a smart home environment, or a smart building environment.

The battery management apparatus 100, battery management apparatus 300, battery management apparatus 400, battery management apparatus 700, battery management apparatus 800, sensitivity determiner 110, execution parameter adjuster 120, sensitivity determiner 310, execution parameter determiner 320, execution parameter adjuster 330, scheduling period setter 410, sensitivity determiner 420, execution parameter determiner 430, execution parameter adjuster 440, scheduler 710, algorithm controller 720, battery manager 730, scheduler 810, algorithm controller 820, battery manager 830, charge/discharge manager 850, and temperature manager 860 described in FIGS. 1, 3-4, and 7-8 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 5-6 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery management apparatus comprising:
a processor configured to:
determine sensitivity of a battery state based on sensed battery information and previous battery state information;
determine an execution parameter, of a battery state estimation algorithm, to be adjusted, based on a calculated variation in the sensitivity; and
adjust the determined execution parameter to estimate, using the battery state estimation algorithm having the adjusted execution parameter, the battery state based on the determined sensitivity of the battery state,
wherein the determining of the execution parameter is based on a type of the battery state estimation algorithm used in the estimating of the battery state.

2. The apparatus of claim 1, wherein the processor comprises:
a sensitivity determiner configured to determine the sensitivity of the battery state based on the sensed battery information and the previous battery state information; and
an execution parameter adjuster configured to adjust the execution parameter for estimating the battery state based on the determined sensitivity of the battery state.

3. The apparatus of claim 2, wherein the sensitivity determiner is further configured to measure a variation per unit time in the battery state based on any one or any combination of the battery information and the previous battery state information, and to determine the sensitivity based on the measured variation per unit time.

4. The apparatus of claim 3, wherein:
the battery information comprises any one or any combination of voltage, current, temperature, charge time, and discharge time considered by the battery state estimation algorithm in the estimating of the battery state; and
the previous battery state information comprises at least one of state of charge (SOC) or state of health (SOH).

5. The apparatus of claim 2, wherein the execution parameter comprises any one or any combination of an execution period, as an indication of when a corresponding battery estimation algorithm is to be executed, a frequency of the execution, and/or other execution timing control, and an optimization process of one or more optimization processes or other processes of the corresponding battery state estimation algorithm.

6. The apparatus of claim 5, wherein the execution parameter adjuster is further configured to shorten the execution period of the corresponding battery state estimation algorithm, in response to an increase in the determined sensitivity.

7. The apparatus of claim 5, wherein the corresponding battery state estimation algorithm comprises any one or any combination of an SOC estimation algorithm and an SOH estimation algorithm, as respective types of battery state estimation algorithms.

8. The apparatus of claim 7, wherein the execution parameter determiner is further configured to performing the determining of the execution parameter to be adjusted and determine a value of the execution parameter, in response to the calculated variation in the sensitivity exceeding a threshold.

9. The apparatus of claim 7, wherein the execution parameter determiner is configured to calculate, as the calculated variation in the sensitivity, a difference between a previous sensitivity determined by an execution of a previous battery state estimation algorithm, and a current sensitivity determined by an execution of a current battery state estimation algorithm.

10. The apparatus of claim 2, wherein the processor further comprises:
a scheduling period setter configured to set an initial operating period of each element of the battery management apparatus as a sensing period of the battery information, and to adjust an operating period of the each element of the battery management apparatus based on the previous battery state information.

11. The apparatus may of claim 1 comprises a memory configured to store instructions that, when executed by the processor, configure the processor to performing the determining of the sensitivity of the battery state based on the sensed battery information and the previous battery state information, the determination of the execution parameter to be adjusted, and the adjustment of the execution parameter to estimate the battery state based on the determined sensitivity of the battery state.

12. A battery management apparatus comprising:
a processor configured to:
determine sensitivity of a battery state based on sensed battery information and previous battery state information; and
determine an execution parameter, of a battery state estimation algorithm, to be adjusted based on a calculated variation in the sensitivity or any combination of a type of the battery state estimation algorithm and the calculated variation in the sensitivity for adjusting the execution parameter to estimate, using the battery state estimation algorithm having the adjusted execution parameter, the battery state based on the determined sensitivity of the battery state.

13. The apparatus of claim 12, wherein the processor is further configured to performing the determining of the execution parameter to be adjusted and determine a value of the execution parameter, in response to the calculated variation in the sensitivity exceeding a threshold.

14. The apparatus of claim 12, wherein the processor is further configured to estimate the battery state, including performing the adjusting of the execution parameter to estimate the battery state based on the determined sensitivity of the battery state.

15. A battery management method comprising:
- determining sensitivity of a battery state based on sensed battery information and previous battery state information;
- determining an execution parameter, of a battery state estimation algorithm, to be adjusted, based on a calculated variation in the sensitivity; and
- adjusting the execution parameter to estimate, using the battery state estimation algorithm having the adjusted execution parameter, the battery state based on the determined sensitivity of the battery state,
- wherein the determining of the execution parameter is based on a type of the battery state estimation algorithm used in the estimating of the battery state.

16. The method of claim 15, wherein the determining of the sensitivity comprises measuring a variation per unit time in the battery state based on any one or any combination of the battery information and the previous battery state information, and determining the sensitivity based on the measured variation per unit time.

17. The method of claim 16, wherein:
- the battery information comprises any one or any combination of voltage, current, temperature, charge time, and discharge time considered by the battery state estimation algorithm in the estimating of the battery state; and
- the previous battery state information comprises at least one of state of charge (SOC) and state of health (SOH).

18. The method of claim 15, wherein the execution parameter comprises any one or any combination of an execution period, as an indication of when a corresponding battery estimation algorithm is to be executed, a frequency of the execution, and/or other execution timing control, and an optimization process of one or more optimization processes or other processes of the corresponding battery state estimation algorithm.

19. The method of claim 18, wherein the adjusting of the execution parameter comprises shortening the execution period, in response to an increase in the determined sensitivity.

20. The method of claim 15, wherein the battery state estimation algorithm comprises any one or any combination of an SOC estimation algorithm and an SOH estimation algorithm, as respective types of battery state estimation algorithms.

21. The method of claim 20, further comprising:
- determining the execution parameter to be adjusted based on any combination of the type of the battery state estimation algorithm and the calculated variation in the sensitivity.

22. The method of claim 15, further comprising:
- setting an initial operating period of each element of a battery management apparatus as a sensing period of the battery information, and adjusting an operating period of the each element of the battery management apparatus based on the previous battery state information.

23. A non-transitory computer-readable storage medium storing instructions that, when executed by a processor, cause the processor to perform the method of claim 15.

* * * * *